(12) United States Patent
Sato

(10) Patent No.: US 6,296,434 B1
(45) Date of Patent: *Oct. 2, 2001

(54) PRODUCT SUPPLY UNIT WITH OFFSET WHEEL AXES FOR NON-TILTING HORIZONTAL PRODUCT SUPPORTS

(75) Inventor: Takemitsu Sato, Yamagata (JP)

(73) Assignee: NEC Corporation, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/247,924

(22) Filed: Feb. 11, 1999

(30) Foreign Application Priority Data

Feb. 13, 1998 (JP) .................................................. 10-031210

(51) Int. Cl.⁷ .................................................. G01R 31/26
(52) U.S. Cl. .................................. 414/223.01; 414/222.01; 414/331.01; 414/731; 198/339.1; 198/469.1; 198/475.1
(58) Field of Search .................. 414/731, 729–744.8, 414/331.01, 331.02, 331.04, 222.01, 223.01, 223.02, 225.01; 198/339.1, 463.1, 469.1, 470.1, 471.1, 472.1, 473.1, 474.1, 475.1; 211/163, 164; 312/266, 267; 472/44, 45, 46; 446/273, 274; 222/164–167; 15/303–311

(56) References Cited

U.S. PATENT DOCUMENTS

| | | | |
|---|---|---|---|
| 3,965,647 | * 6/1976 | Sjoman | 53/117 |
| 4,184,420 | * 1/1980 | Podaras et al. | 99/427 |
| 4,476,649 | * 10/1984 | Zaruba | 446/411 |
| 4,526,134 | * 7/1985 | Sapp | 119/51.13 |
| 4,639,968 | * 2/1987 | McKibben et al. | 15/304 |
| 4,960,275 | * 10/1990 | Magon | 472/13 |
| 5,039,180 | * 8/1991 | Lemons | 312/267 |
| 5,054,155 | * 10/1991 | McKibben et al. | 15/304 |
| 5,076,210 | * 12/1991 | Horn | 119/203 |
| 5,370,247 | * 12/1994 | Handleman | 211/164 |
| 5,421,318 | * 6/1995 | Unruh et al. | 126/25 A |
| 5,938,145 | * 8/1999 | Dueck | 242/559.4 |

FOREIGN PATENT DOCUMENTS 62-79136    4/1987 (JP).

* cited by examiner

Primary Examiner—Robert P. Olszewski
Assistant Examiner—Gerald J. O'Connor
(74) Attorney, Agent, or Firm—Sughrue, Mion, Zinn, Macpeak & Seas, PLLC

(57) ABSTRACT

A product supply unit which has a pair of plate members disposed opposite to each other and connected together by a number of supports that are in between the two plate members and disposed around the circumference of the plate members. Each support has a product holding nozzle used to move a product from a supply point, to a work point, to a stock point.

16 Claims, 10 Drawing Sheets

PRODUCT SUPPLY UNIT WITH OFFSET WHEEL AXES FOR NON-TILTING HORIZONTAL PRODUCT SUPPORTS

FIELD OF THE INVENTION

This invention relates to a product supply unit to be used in manufacturing and assembling a product, such as a semiconductor device.

BACKGROUND OF THE INVENTION

Conventionally, to supply a product just after manufacturing from a stock position to a work position and to stock the product at another position after working are automated by a product supply unit.

Conventional product supply units are explained below, referring to FIGS. 1 and 2.

Figure 1:
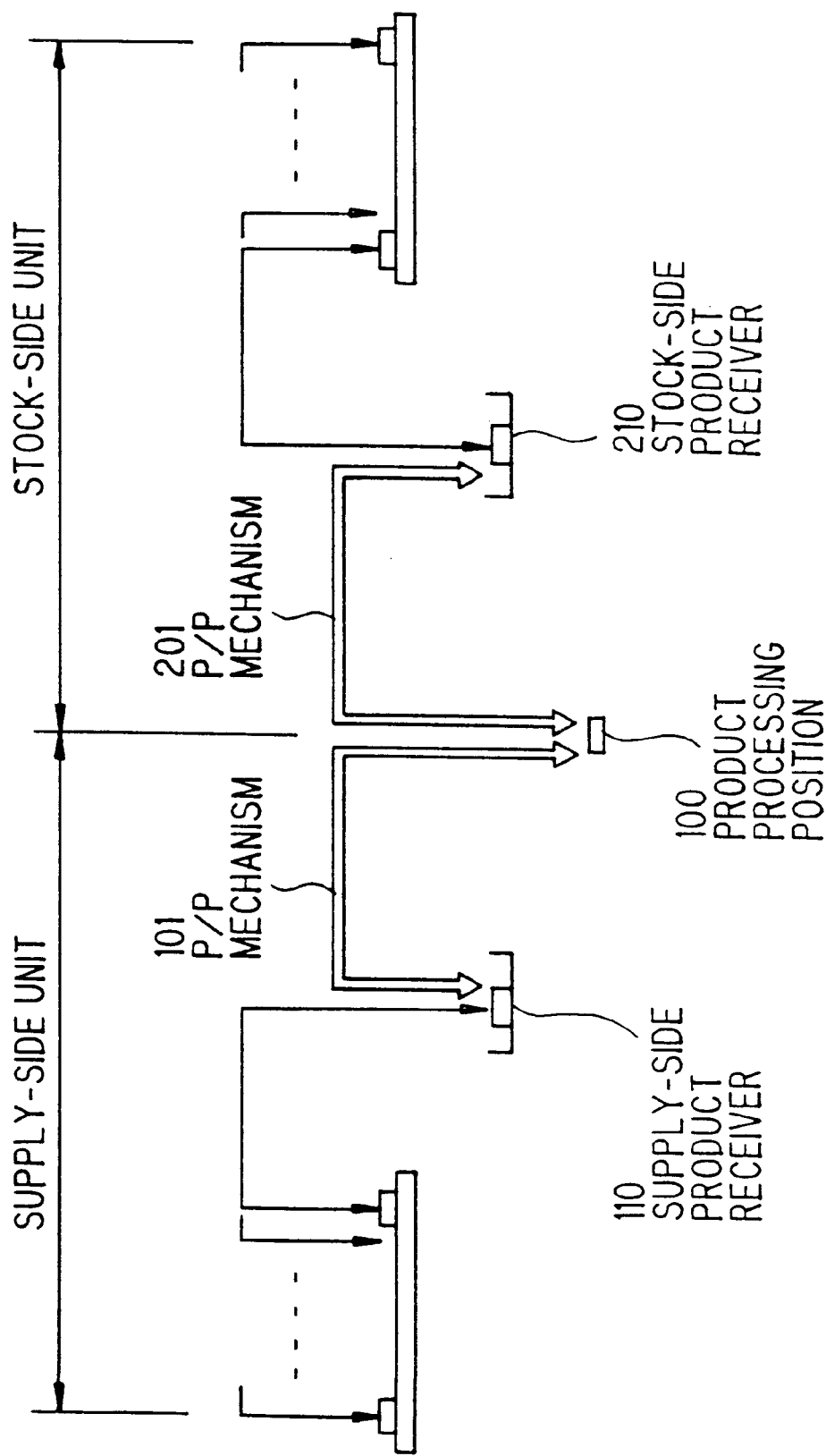

FIG. 1 is an illustration showing the principle of operation in an example of conventional product supply unit. As shown, the conventional product supply unit uses pick and place mechanisms (hereinafter referred to as 'P/P mechanism') 101, 102 where a cam or ball screw and a slide mechanism are combined. In conducting the supply operation or stock operation of a product by these mechanisms, by reciprocating a product holding nozzle, the product is supplied from a supply-side product receiver 110 to a product processing position 100, or is supplied from the product processing position 100 to a stock-side product receiver 210.

Figure 2:
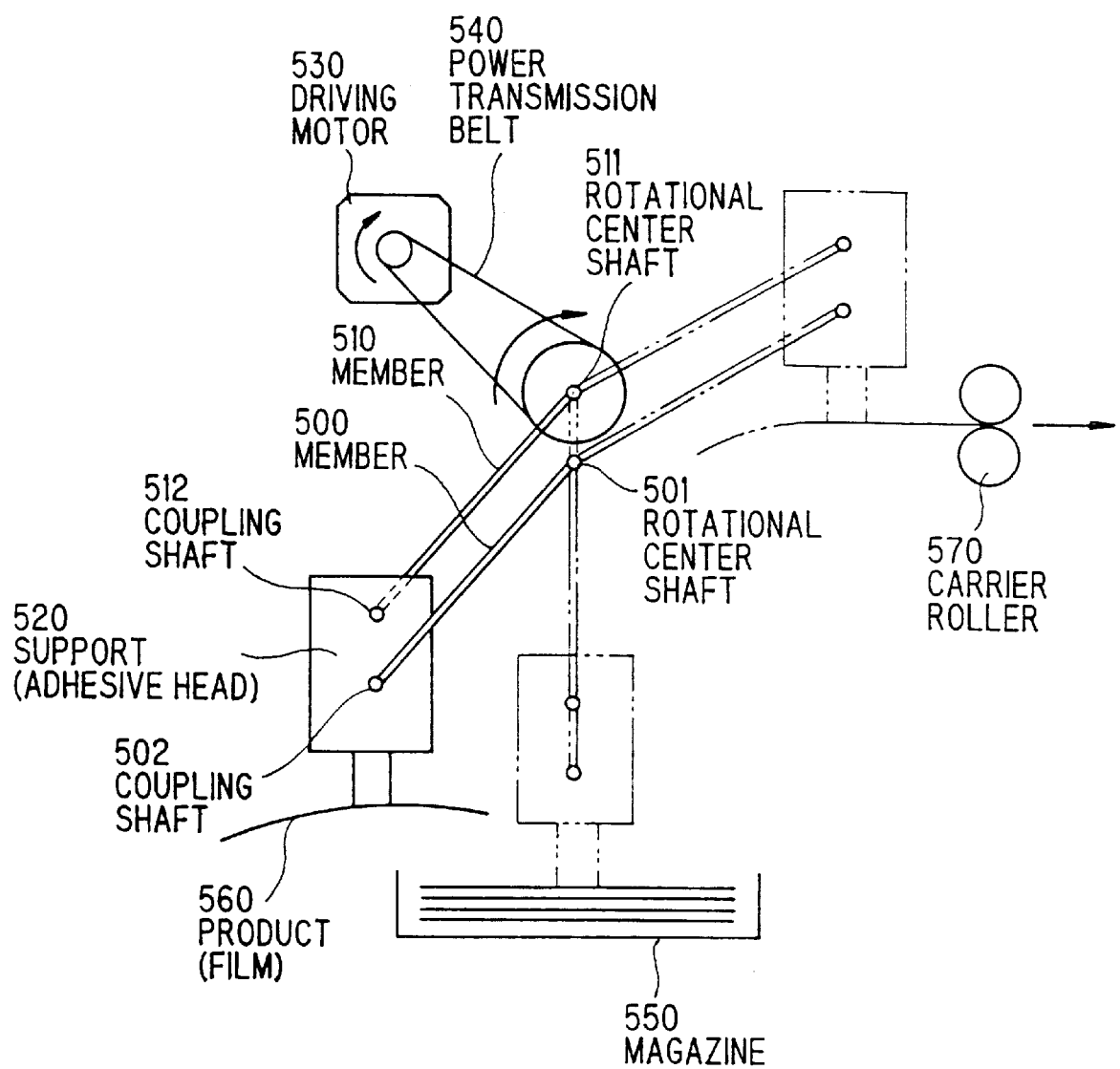

FIG. 2 is an illustration showing the principle of operation in another example of conventional product supply unit disclosed in Japanese patent application laid-open No. 62-79136 (1987). In this example, a link mechanism is used. With this link mechanism, where a support 520 is disposed between members 510 and 500 attached to rotational center shafts 511 and 501, respectively and coupling shafts 512, 502 compose a pair of parallel links, the rotational center shaft 512 is rotated by a driving motor 530 through a power transmission belt 540, thereby picking up a product 560 from a magazine 550 disposed at the lowermost position of the support 520, further rotated to supply it to carrier roller 570 side.

However, in the conventional product supply unit in FIG. 1, there is a problem that the operation time is long. The first reason is that, since the supply and stock of product is conduct by the reciprocating operation and therefore only the product holding nozzle returns on the return way while conducting the lost motion with no supply and stock of product, the operation time is wasted by that much. The second reason is that in the supply operation, the up/down motion of the product holding nozzle for holding the product at the supply-side receiver 110 and the up/down motion of the product holding nozzle at the product processing position 100, and in the stock operation, the up/down motion of the product holding nozzle at the stock-side product receiver 210 are all alternately performed, therefore the operation time is consumed in each of the motions.

Also, in the conventional product supply unit in FIG. 2, there is a first problem that the rotation operation lacks smoothness. The reason is that, when the pair of links align at the uppermost and lowermost positions of the support, the dead point, which is the worst weakness of link mechanisms, occurs and the rotation operation is thereby obstructed. Also, there is a second problem that the precision is significantly lowered at the work position that is assigned to the lowermost position of the support. The reason is that the dead point occurred causes the most unstable structure state of the link mechanism.

On the other hand, the product supply unit may be also used to automate the electrical characteristic test or burn-in test of a semiconductor product. For example, in case of electrical characteristic test, the product is supplied from the supply tray to the contact pin on the measurement box of IC tester, then measured while being pressed at a given contact pressure. After the measurement, the product is selected and stocked at a given place based on the test result. Thus, from the supply until stock of the product, it is automatically conveyed by the product supply unit.

Figure 3:
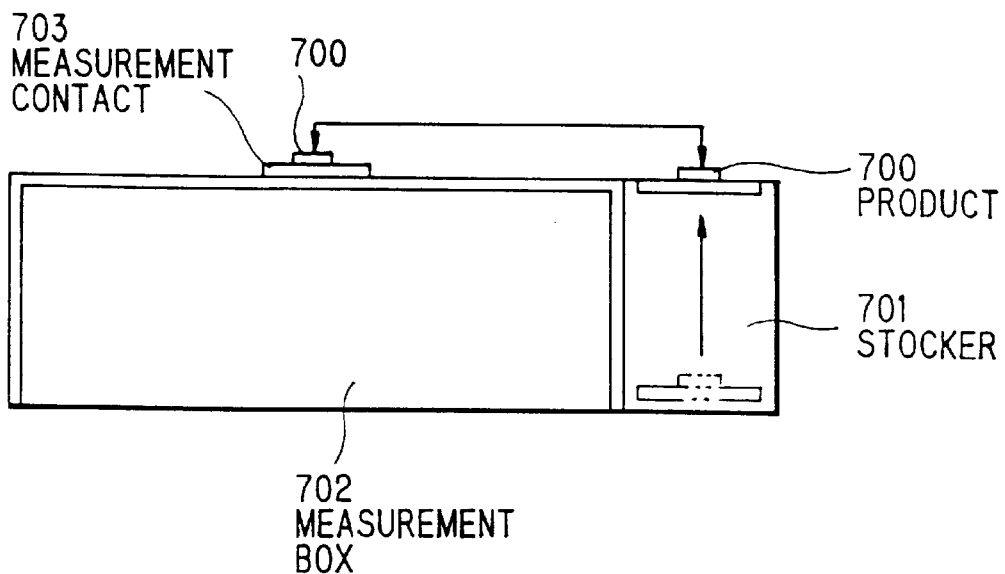

The measurement box where the IC tester and the measured product are mounted has been scaled up with the recent functional enhancement of semiconductor product. For example, when the P/P mechanism is simply used, a stocker (tray elevator) 701 for the supply or stock of a product 700, as shown in FIG. 3, needs to be disposed at the circumference in the plane direction of a measurement box 702 due to the stock amount. Therefore, the distance between the stocker 701 and a measurement contact 703 becomes long and the operation time taken between the stocker 701 and the measurement contact 703 becomes long. Also, the floor area occupied by the unit is large. To shorten the operation time, it can be thought that multiple carrier mechanisms are provided such that they relay the distance between the stocker 701 and the measurement contact 703 and the moving distance assigned to each carrier mechanism is shortened, and the moving speed in the horizontal direction of each carrier mechanism is speeded up. In this case, each carrier mechanism may include not only the P/P mechanism but also a carrier mechanism using a rotary table. However, in such unit composition, the cost of unit must be increased since the number of components increases. Also, there is a problem that the floor area occupied by the unit remains large and thus the outer area of the unit cannot be decreased.

Figure 4:
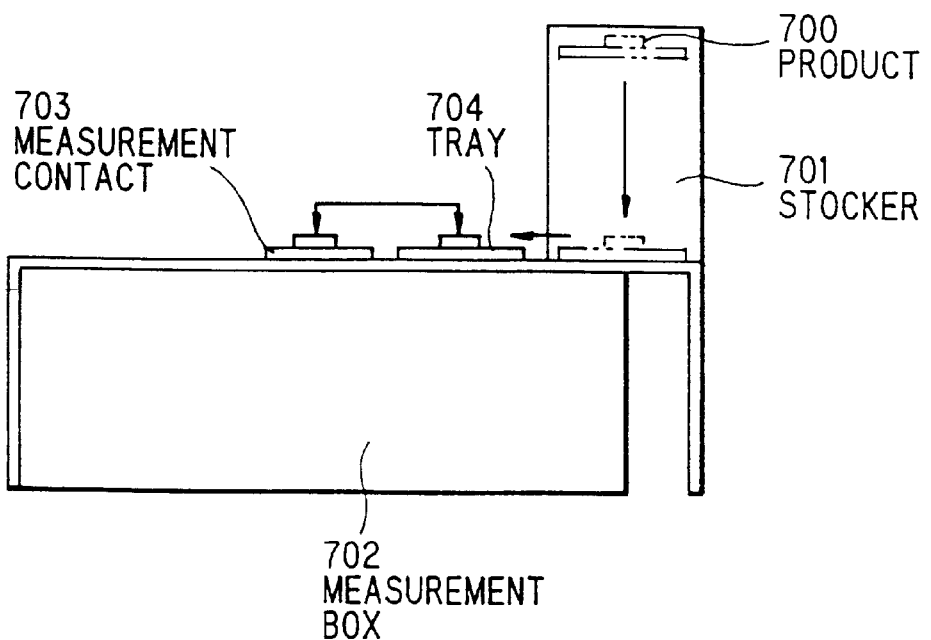

To solve this problem, there is a technique that the stocker 701 is, as shown in FIG. 4, overlaid on the measurement box 702 and a tray 704 is taken out from the bottom of the stocker 701 to supply or stock the product 700 through the tray 704. However, even in this case, the outer area of the unit cannot be decreased since the stage area for mounting the tray 704 to be taken out from the stocker 701 is necessary.

Figure 5:
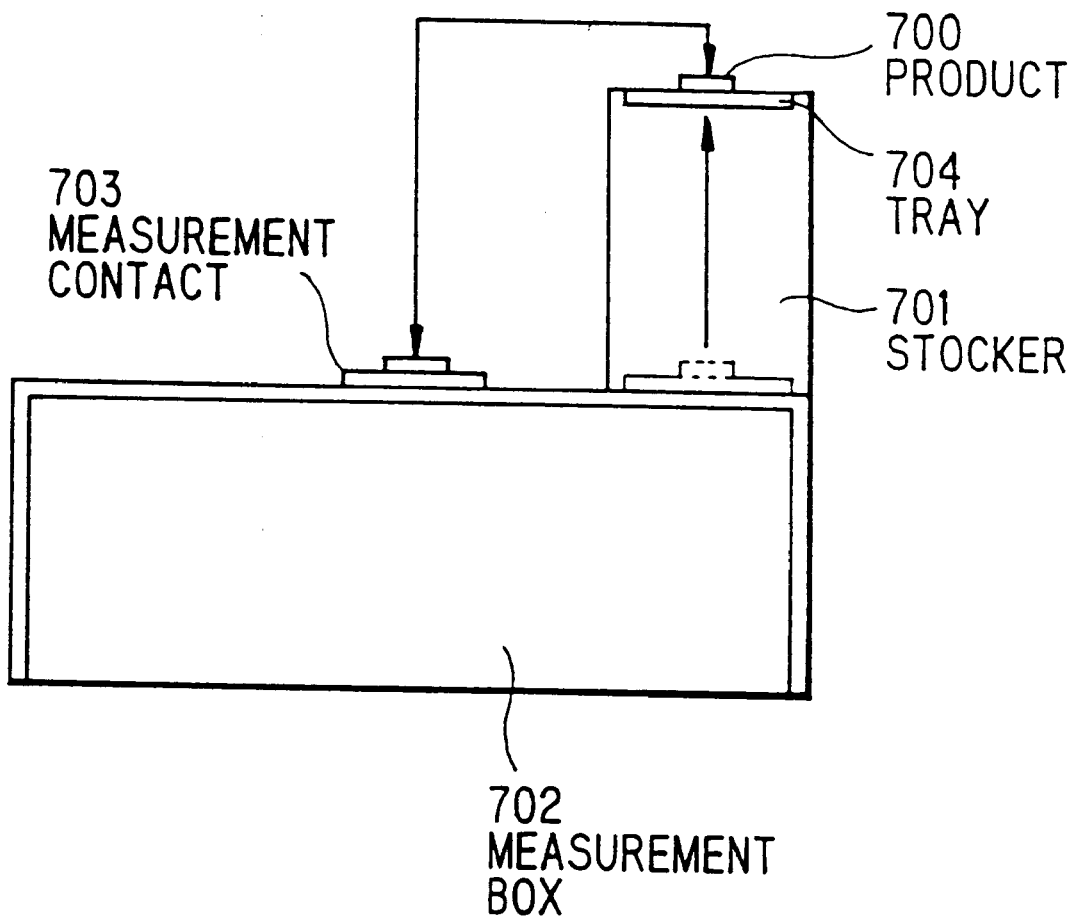

So, as shown in FIG. 5, to realize a mechanism that the product 700 is supplied and stocked directly between the tray 704 on the top of the stocker 701 overlaid on the measurement box 702 and the measurement contact 703 is most effective for shortening the operation time and for decreasing the outer area of unit. In such composition, it is necessary to move the product a distance along the drop height from the top of the stocker to the measurement box lying under the stoker. Hereupon, when the P/P mechanism is used for this transportation, the product is, at a stroke, moved the distance along the drop height by the single mechanism. Therefore, the operation distance for the single mechanism becomes long and the operation time on the forward way becomes very wasteful. Also, when the rotary link mechanism in FIG. 2 is used instead of the P/P mechanism, the position precision of product is significantly lowered at a position where the product support comes to the measurement point at the lowermost, thereby causing an error in measurement.

SUMMARY OF THE INVENTION

Accordingly, it is an object of the invention to provide a compact product supply unit that can realize high-precision, efficient and fast transportation.

According to the invention, a product supply unit, comprising:

a first plate member with a first rotational center shaft;

a second plate member with a second rotational center shaft, the second plate member being disposed opposed to the first plate member;

a plurality of supports disposed, at an equal pitch, on the circumference centered with the first rotational center shaft between the first plate member and the second plate member, and coupled with the first plate member with a first coupling shaft and with the second plate member with a second coupling shaft; and means for holding a product, the product holding means being provided on each of the plurality of supports.

BRIEF DESCRIPTION OF THE INVENTION

Figure 6:
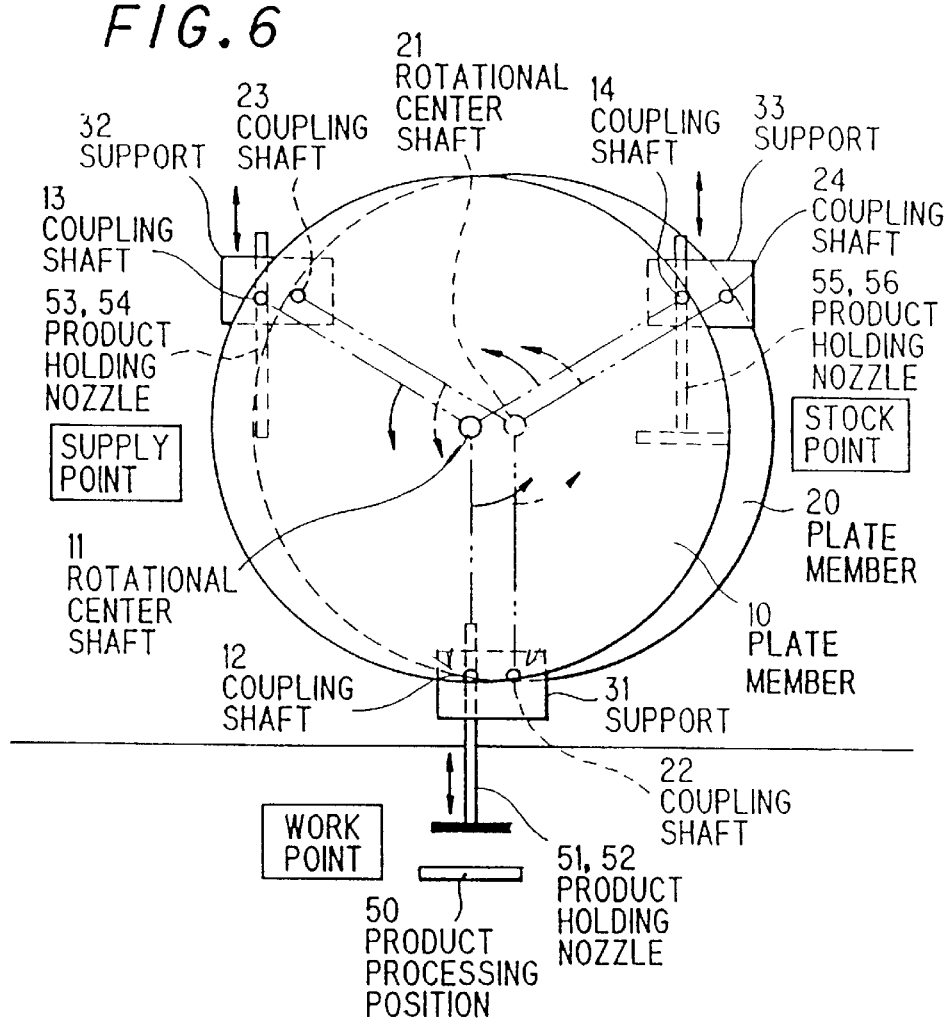
Figure 7:
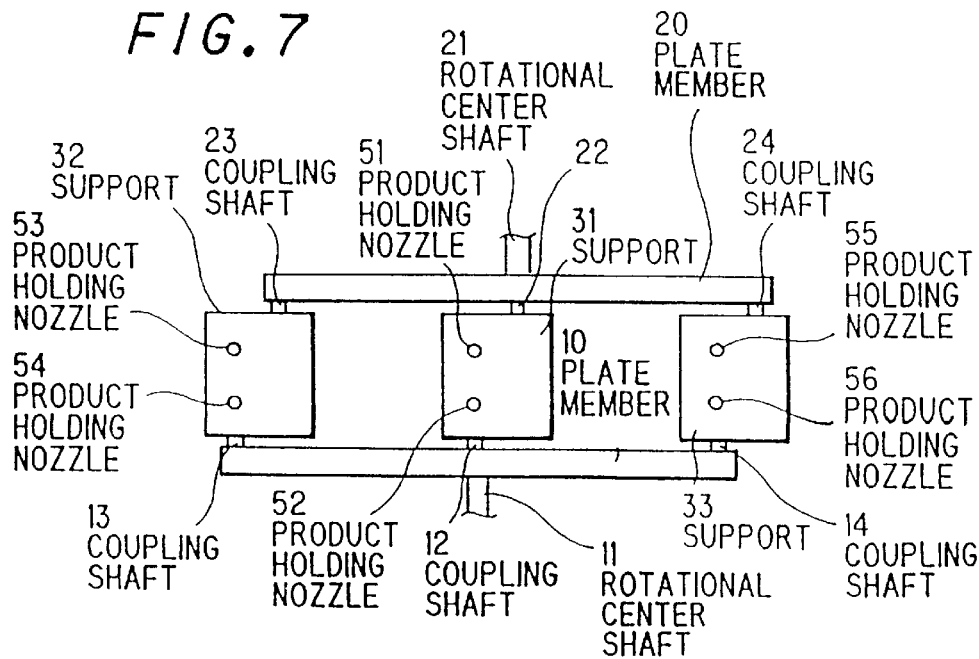
Figure 8:
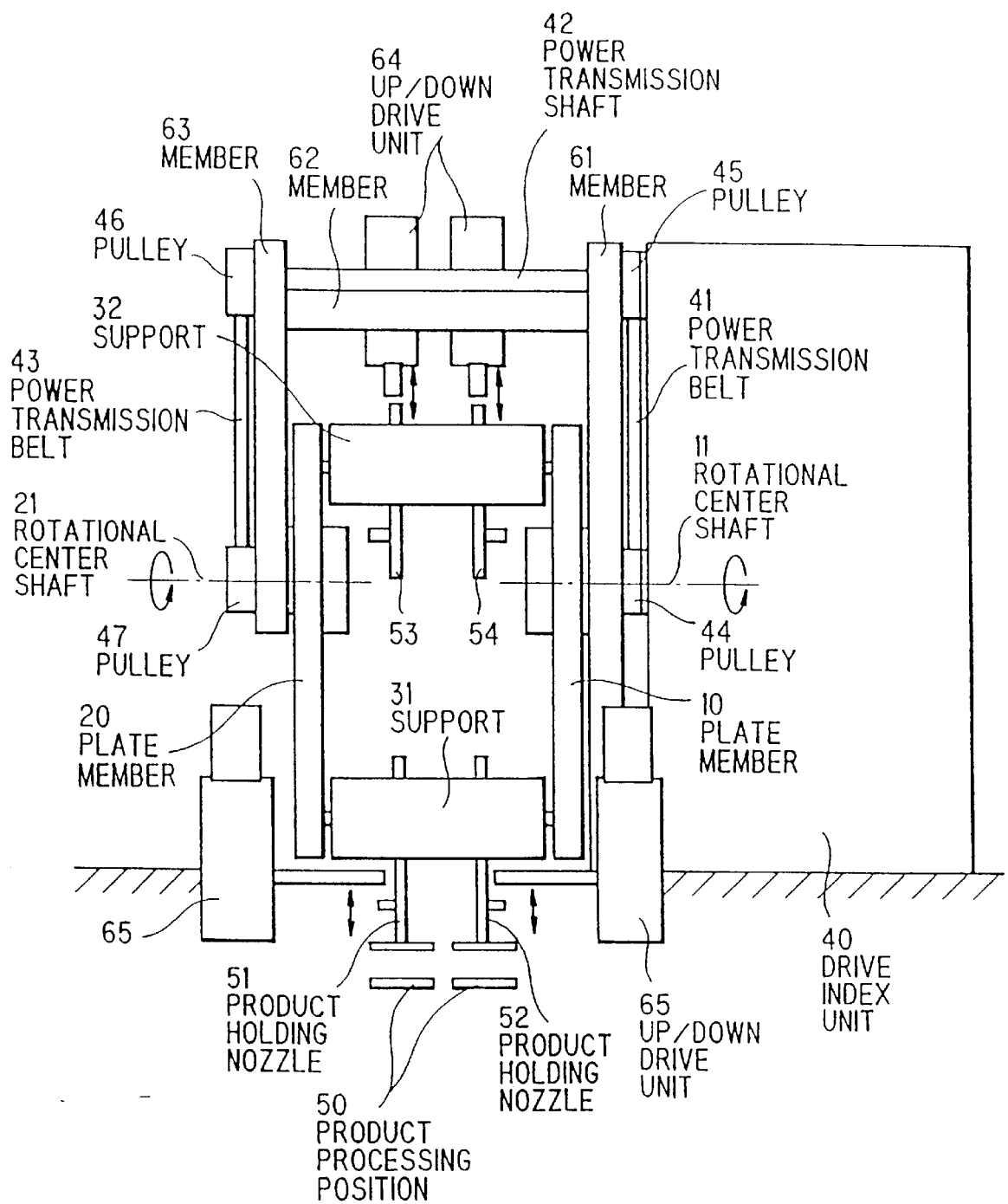
Figure 9:
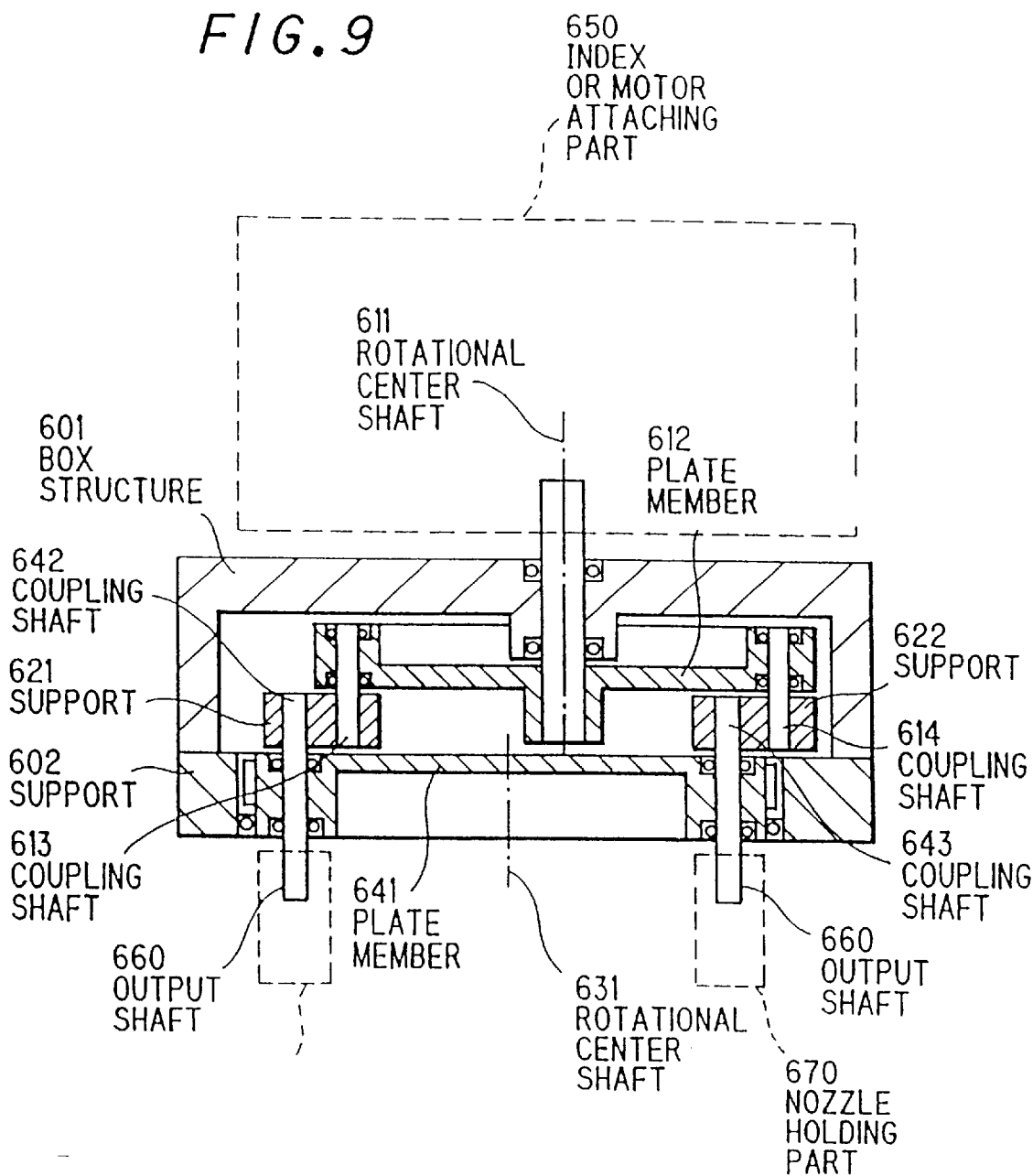
Figure 10:
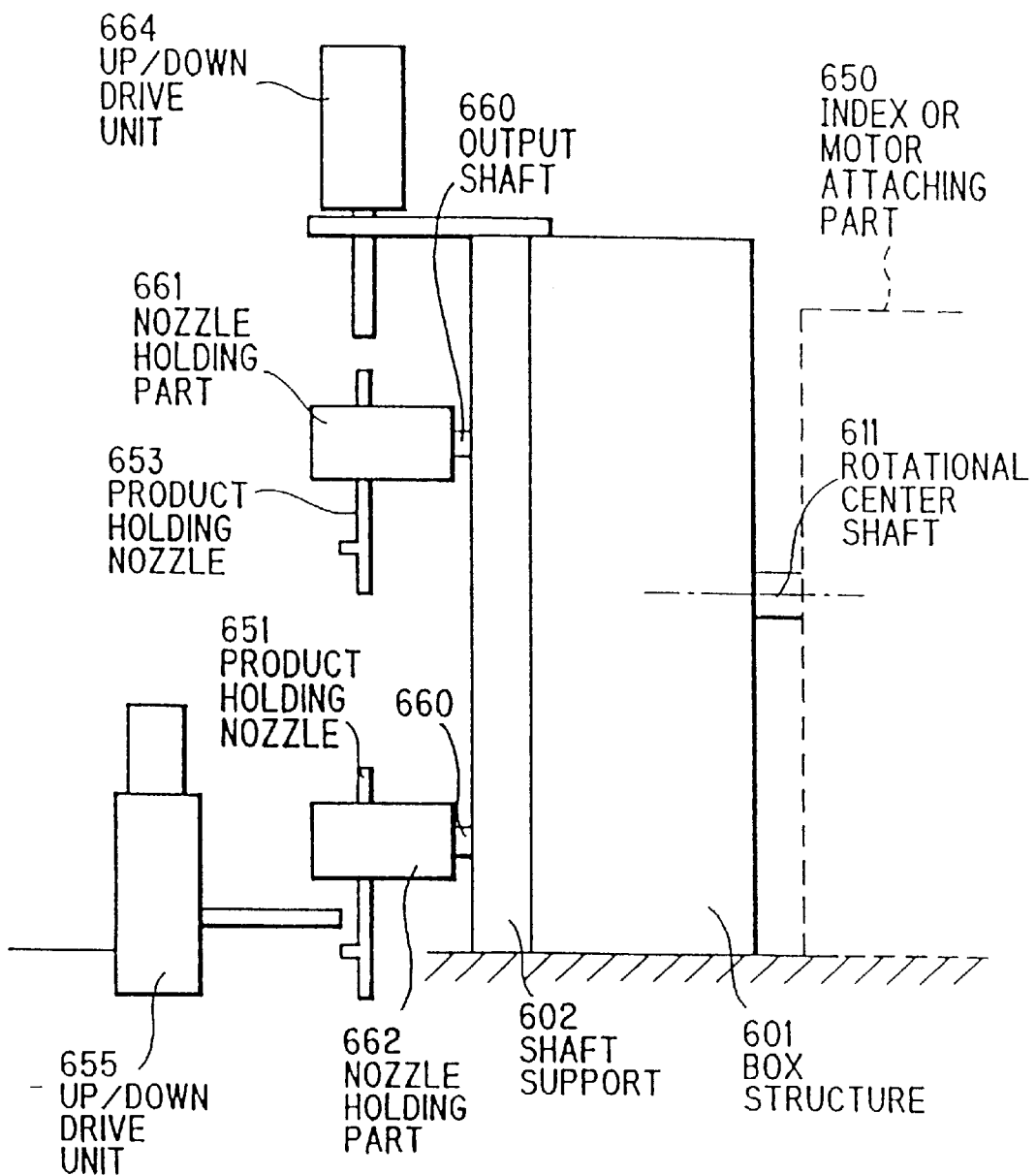
Figure 11:
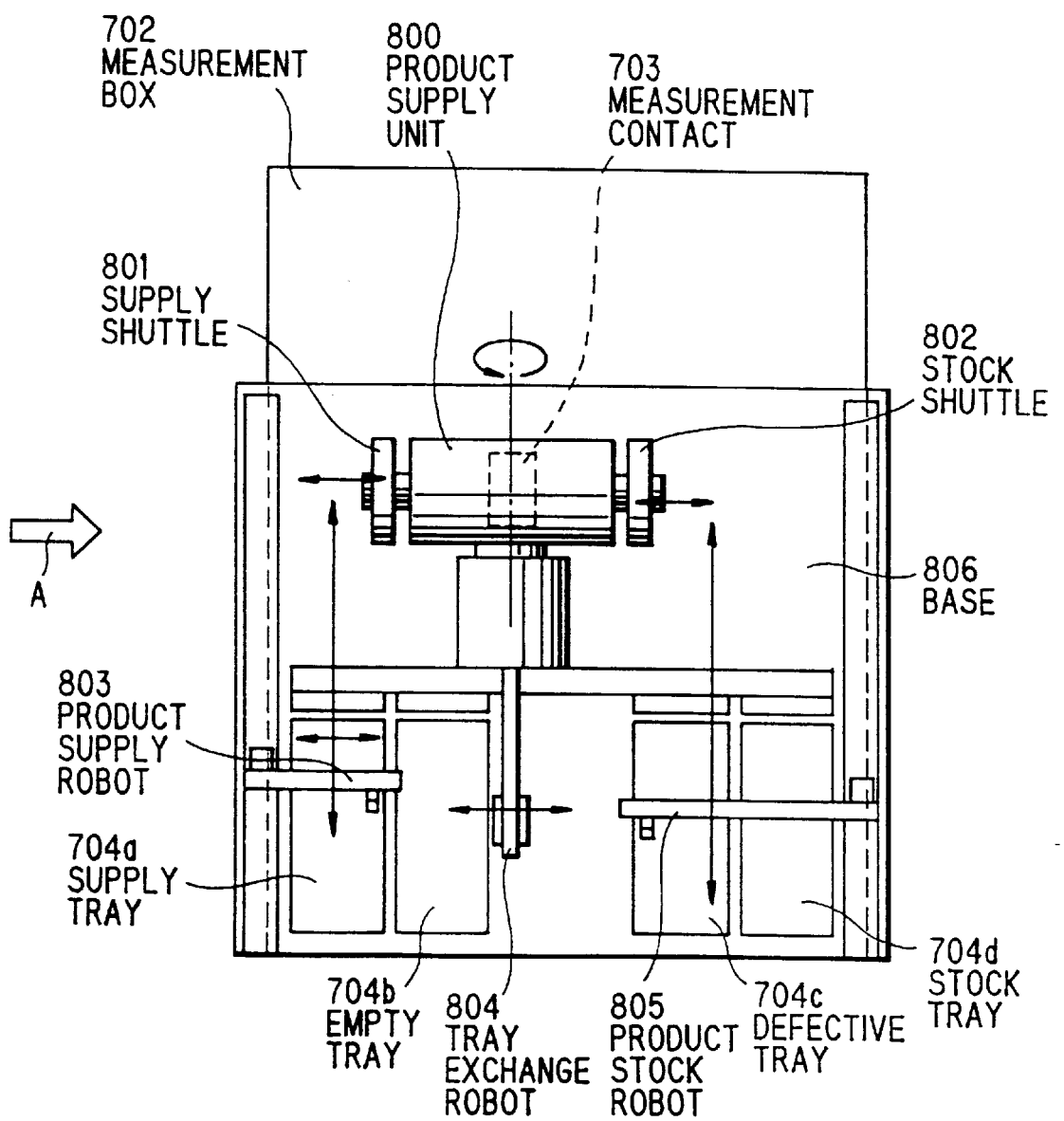
Figure 12:
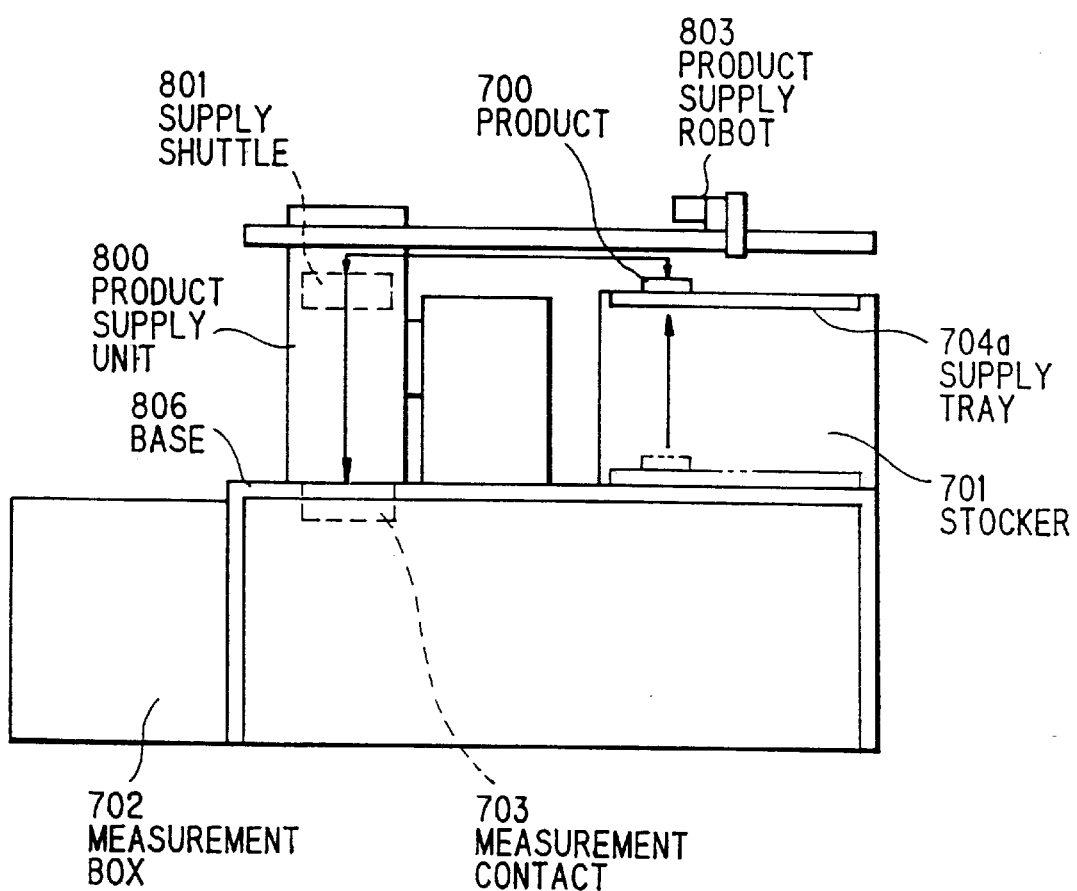

The invention will be explained in more detail in conjunction with the appended drawings, wherein:

FIG. 1 is an illustration showing the operational principle of an example of conventional product supply units, FIG. 2 is an illustration showing the operational principle of a conventional product supply unit disclosed in Japanese patent application laid-open No. 62-79136, FIG. 3 is an illustration showing a unit composition that a conventional product supply unit is used as a carrier mechanism, FIG. 4 is an illustration showing another unit composition that a conventional product supply unit is used as a carrier mechanism, FIG. 5 is an illustration showing a further unit composition that a conventional product supply unit is used as a carrier mechanism, FIG. 6 is a front view showing the characteristic part of a product supply unit in a first preferred embodiment according to the invention, FIG. 7 is a top view showing the characteristic part of the product supply unit in FIG. 6, FIG. 8 is a side view best showing a drive unit in the product supply unit of the first embodiment, FIG. 9 is a top and cross sectional view best showing the characteristic part of a product supply unit in a second preferred embodiment according to the invention, FIG. 10 is a side view best showing a drive unit in the product supply unit of the second embodiment, FIG. 11 is an outline perspective view showing an IC tester that the product supply unit is used as a measurement hander, and FIG. 12 is a side view showing the IC tester in FIG. 11 viewed from the direction of an arrow A in FIG. 11.

DESCRIPTION OF THE PREFERRED EMBODIMENTS

The preferred embodiments of the invention will be explained below, referring to the drawings.

Embodiment 1

FIG. 6 is a front view showing the characteristic part of a product supply unit in the first preferred embodiment according to the invention, FIG. 7 is a top view showing the characteristic part of the product supply unit in FIG. 6, and FIG. 8 is a side view showing best the drive unit of the product supply unit in the first embodiment.

In the product supply unit in this embodiment, as shown in FIGS. 6 and 7, a plate member 10 to rotate around a first rotational center shaft 11 and a plate member 20 to rotate around a second rotational center shaft 21 are disposed opposed to each other. The first and second rotational center shafts 11, 21 are fixed a given distance apart from each other in the horizontal direction. Between the plate members 10 and 20, multiple supports 31, 32 and 33 are disposed at equally-divided positions on the circumference centered with the rotational center shafts 11, 21 of the plate members 10, 20.

The support 31 is connected through a coupling shaft 12 to the plate member 10, and through a coupling shaft 22 to the plate member 20. Thereby, a pair of parallel links are formed by the coupling shaft 12 and rotational center shaft 11 and the coupling shaft 22 and rotational center shaft 21 for the support 31. Similarly, the support 32 is connected through a coupling shaft 13 to the plate member 10, and through a coupling shaft 23 to the plate member 20. Thereby, a pair of parallel links are formed by the coupling shaft 13 and rotational center shaft 11 and the coupling shaft 23 and rotational center shaft 21 for the support 32. Further, the support 33 is connected through a coupling shaft 14 to the plate member 10, and through a coupling shaft 24 to the plate member 20. Thereby, a pair of parallel links are formed by the coupling shaft 14 and rotational center shaft 11 and the coupling shaft 24 and rotational center shaft 21 for the support 33. Thus, in this unit, the multiple parallel links are simultaneously formed by the two opposed plate members and the multiple supports equally disposed centered with the rotational center shaft of the two plate members. Meanwhile, the links are indicated by two-dotted lines in FIG. 6.

This embodiment, as shown in FIGS. 6 and 7, has the three supports, and is structured such that a position where a support comes to the lowermost point is assigned to the work point and the positions of the other supports are assigned to the supply point and the stock point, and such that each support moves rotating sequentially to each point. Also, the rotational center shafts 11, 21 are positioned 30 to 40 mm apart from each other in the horizontal direction so that one pair of parallel links form a rectangle when the support is at the work point. Also, the coupling shafts 12, 22, coupling shafts 13, 23 and coupling shafts 14, 24, respectively, are positioned 30 to 40 mm apart from each other in the horizontal direction. Although, in FIG. 6, the plate members 10, 20 are shown as a circle form, the form of the plate members 10, 20 may be changed by providing a hole or aperture for weight saving insofar as the composition of the multiple parallel links can be kept.

Also, the support 31 is provided with product multiple holding nozzles 51, 52 used in the supply or stock of product. Similarly, the support 32 is provided with product multiple holding nozzles 53, 54, and the support 33 is provided with product multiple holding nozzles 55, 56. Although, in this embodiment, each support is provided with two product holding nozzles, it may be provided with any number of nozzles.

Each of the product holding nozzles has a structure enabled to move up and down, and is in normal energized upward by a spring etc. Also, at each of the supply point, work point and stock point, as shown in FIG. 8, up and down drive units 64, 65 are disposed. In driving the product holding nozzle to move up and down, at the supply point, work point and stock point, the product holding nozzle is left at the up position by the springy force of a spring etc. without driving the up and down drive units 64, 65, or is moved down against the spring by driving the up and down drive units 64, 65. In this case, the up and down drive units can use an air cylinder, a cam, a ball screw etc. Especially in case of the ball screw, the stop position and operation speed of the product holding nozzle can be set arbitrarily.

The means for inputting the rotational power to the plate members 10, 20 is a drive index unit 40 provided on the rotational center shaft 11 side as shown in FIG. 8. The drive index unit 40 divides the rotation into desired equal angles. Thus, the rotation is suspended every time it rotates by the desired equal angle. Meanwhile, this angle is a value obtained by dividing 360 degrees, one roll, by the number of supports.

The rotational center shaft 11 of the plate member 10 is rotatably supported by a member 61 fixed to a unit base 806. The rotational center shaft 21 of the plate member 20 is rotatably supported by a member 63 fixed through a member 62 to the member 61.

The unit of this embodiment is provided with a rotary power transmission means that transmits the rotary power, which is input from the drive index unit 40 to the rotational center shaft 11, also to the rotational center shaft 21 simultaneously when inputting it to the rotational center shaft 11. Namely, the rotary power transmission means is composed such that the rotary power is transmitted from a pulley 44 attached to the rotational center shaft (axis) 11, through a power transmission belt 41, pulleys 45, 46 attached to a power transmission shaft 42, a power transmission belt 43 and a pulley 47 attached to the rotational center shaft 21, to the rotational center shaft 21. In the rotary power transmission means thus-composed, the rotation of the drive index unit 40 may be input to the power transmission shaft 42 other than the rotational center shaft 11 or 21.

The reasons why the rotary power is input through the rotary power transmission means also to the rotational center shaft 21 are as follows: In this unit, while the plate member and support are fast rotated by the drive index unit 40, the suspending is conducted at each of the supply point, work point and stock point. Therefore, if the two plate members are rotated only by the rotary input to one rotational center shaft, the moment of inertia due to the rotation and stop of the plate member and support has to be received by only the coupling shaft of each support. Also, when the number of the product holding nozzles provided on the each support is increased and their intervals are widened, the interval of power-applied points of the coupling shafts coupling between the two plate members and the support is also widened, therefore the structural torsion is apt to occur. As a result, there occurs a risk that the precision of stop position of each product holding nozzle may be unsecured. When, as a way to prevent this, the rigidity of the plate member and support is enhanced, the weight of components increases, thereby increasing the moment of inertia at the intermittent motions where the rotation and the stop are repeated, requiring the drive power to be enhanced.

Because of this, the rotary power is input through the transmission means also to the rotational center shaft 21 so as to make the rotational shafts of the two plate members rotate synchronously to prevent the above problems. Thereby, the torsion can be prevented from occurring. As a result, since the rigidity of components need not to be enhanced, the weight-saved components a can be used, thereby reducing the moment of inertia. Further, the intermittent motions where the fast rotation and stop are repeated can be driven with small power and high precision.

The operations of the product supply unit in this embodiment are explained below.

In supplying the product, at first, the product holding nozzle stops at the supply point. Here, the product holding nozzle is up/down operated by the up/down drive unit for product holding nozzle equipped at the supply point, thereby the product is held. Then, the product holding nozzle is moved to the work point while holding the product. Then, the product holding nozzle is downed to a product processing position 50 by the up/down drive unit for product holding nozzle equipped at the work point, thereby the product is supplied. Meanwhile, when the product holding nozzle is up/down operated at the work point, the next product holding nozzle located at the supply point is up/down operated at the same timing as that in the up/down operation of the product holding nozzle at the work point, thereby the product is held.

In stocking the product, the product after completing the work at the work point is held by the up/down operation of the product holding nozzle, moved to the stock point. Here, the product holding nozzle is up/down operated by the up/down drive unit for product holding nozzle equipped at the stock point, thereby the product is stocked at the stock point. At this time, the next product holding nozzle having been moved has arrived at the work point, and is then up/down operated at the same timing as that in the up/down operation of the product holding nozzle at the stock point, thereby the product is supplied to the work point.

As described above, to move the product-held nozzle from the supply point to the work point, to move the product-held nozzle after completing the work, and to move the no-product-held nozzle after stocking can be conducted simultaneously and efficiently. Therefore, the operation time can be reduced.

Also, the rotary power to be input to the rotational center shaft 11 is transmitted through the power transmission belt 41, power transmission shaft 42 and power transmission belt 43 also to the rotational center shaft 21. Thereby, each of the multiple parallel links simultaneously composed of the plate members 10 and 20, supports 31, 32 and 33, and coupling shafts 12, 22, 13, 23 and 14, 24 to couple these supports moves rotating around the rotational center shafts 11, 21 while keeping the product holding nozzle attached to each support to have a constant attitude in the vertical direction. Since the respective pairs of parallel links are simultaneously formed between the plate members 10 and 20, even when any one pair of links are overlapped into a line during the rotational operation and thereby the dead point, which is the worst weakness of link mechanisms, occurs, the other one pair of links are in a stable configuration that is not overlapped into a line. Therefore, the dead point can be cancelled by the constraint force from the other links and the rotational operation can be conducted smooth. Also, when the support stops at the work point located lowermost, as shown in FIG. 6, one pair of links locating at that position compose a most-stable rectangle with the rotational center shaft 11 of the plate member 10, the rotational center shaft 21 of the plate member 20, the coupling shaft 12 to couple the support 31 and the plate member 10, and the coupling shaft 22 to couple the support 31 and the plate member 20. Further, by the other one pair of links composed of the two plate members and support, the one pair of links located at the work point are constrained. Therefore, the precision of stop position of the support located at the work point can be, of course, maximized, and further the constraint force can also work mutually between the supports located at the supply point and the stock point, thereby giving the stabilization of the precision of stop position.

Embodiment 2

FIG. 9 is a top and cross sectional view best showing the characteristic part of a product supply unit in the second preferred embodiment of the invention.

In this embodiment, like the first embodiment, as shown in FIG. 9, a plate member 612 to rotate around a first rotational center shaft 611 and a plate member 641 to rotate around a second rotational center axis 631 are disposed opposed to each other. The first and second rotational center shafts (axes) 611, 631 are fixed a given distance apart from each other in the horizontal direction. Between the plate members 612 and 641, multiple supports 621, 622 etc. compose simultaneously multiple parallel links by coupling shafts 613, 614 and 642, 643, and are disposed at equally-divided positions on the circumference of the plate members 612, 641.

In this embodiment, the two plate members 612, 641 composing the parallel links are contained in a concave box structure 601. The plate member 641i s rotatably supported by a shaft support 602. Also, the concave opening of the box structure 601 is sealed with the plate member 641 and the shaft support 602.

The rotational center shaft 611 of the plate member 612 protrudes outside the box structure 601 and serves as an input shaft of the drive power. To the rotational center shaft 611, an index unit, a direct drive motor or the like is attached to conduct the intermittent operation where the rotation and stop of the plate member are repeated.

Also, the coupling shafts 642, 643 to couple the supports 621, 622 with the plate member 641 protrude, as output shafts 660, outside the plate member 641.

To these output shafts 660, as shown in FIG. 10, nozzle holding parts 661, 662 with multiple product holding nozzles 651, 653 are attached.

Each of the product holding nozzles 651, 653 has a structure enabled to move up and down, and is in normal energized upward by a spring etc. Also, at each of the supply point, work point and stock point, as shown in FIG. 10, up and down drive units 664, 665 are disposed. The way to drive the product holding nozzle to move up and down is as described earlier in the first embodiment.

Accordingly, of the characteristics in this embodiment, which is different from that in the first embodiment, the first one is that the link mechanism is enclosed with the box structure. Therefore, by supplying lubricant into the box structure, the durability of unit can be enhanced.

The second is that the product holding nozzles are attached not to the supports 621, 622 disposed between the two plate members 612 and 641, but to the output shafts 660 protruding from the side of the plate member 641 reverse to the side facing the box structure 601.

The third is that, without driving simultaneously the rotational center shafts of both the plate members, the drive power is input from only the input shaft on one side. In this embodiment, since the product holding nozzles are disposed not between the plate members but outside the plate member, the interval between the two plate members is narrow and the interval of the points subject to the force of the coupling shaft of the support is also narrow. As a result, the structure that there occurs little 'torsion' and that is sufficiently applicable with the rigidity of the respective components can be made. Therefore, in contrast to the first embodiment, the input only to the rotational center shaft of one plate member can be employed.

Embodiment 3

A composition that the product supply unit in the first or second embodiment is applied to a handler of IC tester is explained below, referring to FIGS. 11 and 12.

FIG. 11 is an outline perspective view showing an IC tester where the product supply unit of the invention is applied as a measurement hander. FIG. 12 is a side view showing the IC tester in FIG. 11 viewed from the direction of an arrow A.

As shown in FIGS. 11 and 12, a measurement box 702 of the IC tester is disposed under a base 806 supported by its foots. On the base 806, the product supply unit 800 in the above embodiments is disposed. Here, the lowermost work point of the product supply unit 800 is located at a measurement contact 703 of the measurement box 702. Nearby the supply point of the product supply unit 800, a supply shuttle 801 to deliver the product to the product holding nozzle at the supply point is disposed. Similarly, nearby the stock point of the product supply unit 800, a stock shuttle 802 to receive the product held by the product holding nozzle at the stock point is disposed.

Also, on the base 806, four stockers 701 for the supply of product, empty tray, stock of defective, and stock of non-defective product are disposed neighboring to the product supply unit 800. These stockers have an elevator mechanism to move up/down a tray where the product 700 is loaded. Also, the products 700 are disposed, like a grid, on the tray.

The stocker for the supply of product stocks a supply tray 704a where the product 700 to be supplied to the supply tray 801 is loaded. The product locating at an arbitrary point on the supply tray 704a is carried to the supply shuttle 801, a fixed point, by a product supply robot 803.

The stocker for empty tray stocks an empty tray 704b after the product 700 on the supply tray 704a at the top of the product supply stocker is all supplied to the product supply unit 800. The empty tray 704b is carried from the top of the product supply stoker to the stocker for empty tray by a tray exchange robot 804.

The stocker for defective stocks a defective tray 704c where the product 700 to be carried to the stock shuttle 802 after being determined as a defective in the measurement at the measurement contact 703 is loaded. Also, the stocker for non-defective product stocks a stock tray 704d where the product 700 to be carried to the stock shuttle 802 after being determined as a non-defective in the measurement at the measurement contact 703 is loaded. To an arbitrary point on the defective tray 704c or stock tray 704d, the product on the stock shuttle 802, a fixed point, is carried by a product stock robot 805.

For the product supply robot 803 and the product stock robot 804, a P/P mechanism with X-Y orthogonal type robot is preferably used to allow the flexible movement between an arbitrary point and the fixed point.

In the above composition, the product 700 on the supply tray 704a at the top of the product supply stocker of the stockers 701 is carried to the supply shuttle 801 by the product supply robot 803. Then, by the supply shuttle 801, the product 700 is supplied to the product holding nozzle locating at the supply point of the product supply unit 800. Then, the product holding nozzle locating at the supply point moves to the measurement contact 703 at the work point.

Then, by the rotational operation of the product supply unit 800 in the vertical direction, the product 700 is, at a stroke, moved the distance along the drop height from the top height of the stocker to the measurement contact 703 at the bottom of the stocker.

Then, the electrical characteristic of the product 700 is measured at the measurement contact 703. At the same timing as the product 700 is measured, the next product 700 is supplied to the product holding nozzle locating at the supply point of the product supply unit 800.

The product 700 after the measurement is moved to the stock point by the rotational operation of the product supply unit 800 in the vertical direction. The product 700 arriving at the stock point is received by the stock shuttle 802. Then, the product 700 on the stock shuttle 802 is, depending on the measurement result, carried onto the empty tray 704c or stock tray 704d on the top of the stocker 701, by the product stock robot 805.

When thus stocking the product 700 onto the empty tray 704c or stock tray 704d, the next product 700 is arriving at the measurement contact 703 and is then measured at the same timing as the product is received by the stock shuttle 802.

Accordingly, in this embodiment, to move, at a stroke, the distance along the drop height from the top height of the stocker 701 to the measurement contact 703 of the measurement box 702 disposed under the stocker 701 at the bottom of the stocker, by the single mechanism, like the conventional unit is not conducted. Namely, part allowing the operation from a fixed point to a fixed point (e.g., from the supply point to the work point) is assigned to the link mechanism of the invention, with no return way, by the one-directional rotary movement. By this mechanism, to move the distance along the drop height is allowed. Also, part to need the flexible operation from the supply or stock point, which is the fixed point locating at a height nearly equal to the top of the stocker 701, to an arbitrary point on the tray at the top of the stocker 701 is assigned to the P/P mechanism. Thus, by combining the link mechanism and the P/P mechanism while keeping both their characteristics effective, the high-speed operation can be efficiently realized. Also, though the distance along the drop height occurs due to the stocker disposed on the measurement box to make the outer area of unit compact, the operation time can be reduced. In other words, the compact-outer-area unit can be obtained without reducing the operation time.

Further, in the rotary link mechanism of the invention, since the precision of product stop position is highest at the position where the product arrives at the measurement point, lowermost point, the reliability in measurement precision can be secured.

Meanwhile, though, in this embodiment, the product supply unit of the invention is applied to the handler of IC tester, it can be also applied to a product inserter-ejecter for the process of burn-in test. The product inserter-ejecter for the process of burn-in test supplies the product to an arbitrary contact socket attached on a board for burn-in test which is disposed at the bottom of a product supply mechanism, stocking it after the measurement. Therefore, the location and composition of the product supply unit can be similar to those of the product supply unit applied to the handler of IC tester.

ADVANTAGES OF THE INVENTION

The first advantage of this invention is that, in addition to the smooth rotational movement obtained, the occurrence of jouncing is little and the precision of stop position can be secured even when being suspended at the supply point, work point and stock point. This is because the dead point, which is the worst weakness of link mechanisms, is cancelled by that the multiple links built simultaneously by the coupling of the two plate members and the multiple supports constrain each other, and because, at the stop of the respective points, the movement is also restricted by the mutual constraints among the link mechanisms.

The second advantage of the invention is that, at the work point to greatly require the precision, the precision of stop position is maximized. This is because, by making the rotational center shafts a certain distance apart from each other in the horizontal direction, in stopping at the work point, the pair of parallel link mechanisms compose the rectangle and thereby are best stabilized in structure.

The third advantage of the invention is that the operation time can be reduced since the supply or stock operation can be conducted simultaneously when conducting the operation at the work point and, further, the moving operation in the supply of product to the work point or in the stock of product from the work point can be conducted requiring no return-way. This is because the next product holding nozzle arrives moving sequentially since the supports and product holding nozzles are disposed at the equally-divided positions on the rotation circumference of the link mechanism and are moved conducting the index-rotation.

The fourth advantage of the invention is that the compact-outer-area unit can be obtained without reducing the operation time. This is because the wasteful operation time on the return way in the P/P mechanism is removed as described in the above third advantage, and therefore, even when the stocker is disposed on the measurement box, the product can be efficiently moved the distance along the drop height between the top of the stocker and the upper plane of the measurement box.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A product supply unit, comprising:
   a first plate member with a first rotational center shaft;
   a second plate member with a second rotational center shaft, said second plate member opposed to said first plate member;
   a plurality of supports disposed between said first plate member and said second plate member wherein one of said plurality of supports is coupled to said first plate member with a first coupling shaft and to said second plate member with a second coupling shaft; and
   a product holding means for holding a product provided on said one of said plurality of supports; and
   wherein an axis of said first rotational center shaft is offset from an axis of said second rotational center shaft.

2. A product supply unit according to claim 1, wherein said first rotational center shaft and said first coupling shaft and said second rotational center shaft and said second coupling shaft compose a pair of parallel links.

3. A product supply unit, according to claim 2, wherein said first rotational center shaft and said second rotational center shaft are separated by a distance measured in the horizontal direction that is orthogonal to an axial direction of said first rotational shaft.

4. A product-supply unit according to claim 3, wherein said first coupling shaft and said second coupling shaft are separated by the same distance, measured in the horizontal direction that is orthogonal to an axial direction of said first rotational shaft, as said distance between said first rotational center shaft and said second rotational center shaft.

5. A product supply unit according to claim 1, wherein a position where one of said plurality of supports is located at the lowermost point is a work point.

6. A product supply unit according to claim 1, further comprising a plurality of up and down drive units for moving said product holding means up and down.

7. A product supply unit according to claim 1, further comprising a means for inputting rotary power to either of said first rotational center shaft and said second rotational center shaft.

8. A product supply unit according to claim 7, wherein each of said plurality of supports is coupled to said first plate member and said second plate member, and wherein said rotary power inputting means suspends the rotary power at angular positions equal in number to the number of said plurality of supports.

9. A product supply unit according to claim 8, further comprising means for transmitting the rotary power input to either of said first rotational center shaft and said second rotational center shaft to either of said first and second rotational center shafts where the rotary power is not input.

10. A product supply unit according to claim 8, further comprising a box structure containing either of said first plate member or said second plate member; and a shaft support to rotatably support either of said first plate member and said second plate member that is not contained in said box structure wherein either said first and said second plate member is sealed by said box structure.

11. A product supply unit according to claim 1, wherein said product is a semiconductor.

12. A product supply unit according to claim 1, wherein said first rotational center shaft and said second rotational center shaft are placed between approximately 30 mm to 40 mm apart from each other in the horizontal direction, measured in the horizontal direction that is orthogonal to an axial direction of said first rotational shaft.

13. A product supply unit according to claim 1, wherein said product holding means is a product holding nozzle that moves in the vertical direction.

14. A product supply unit according to claim 1, wherein power is simultaneously transmitted to said first rotational center shaft and said second rotational center shaft.

15. A product supply unit according to claim 1, wherein an axis of said first coupling shaft is offset from and axis of said second coupling shaft.

16. A product supply unit according to claim 15, wherein a distance of said offset between the axis of said first coupling shaft and the axis of said second coupling shaft is the same as a distance of said offset between the axis of said first rotational center shaft and the axis of said second rotational center shaft.

* * * * *